United States Patent
Busche et al.

(10) Patent No.: US 9,986,598 B2
(45) Date of Patent: May 29, 2018

(54) TEMPERATURE CONTROL APPARATUS INCLUDING GROOVE-ROUTED OPTICAL FIBER HEATING, SUBSTRATE TEMPERATURE CONTROL SYSTEMS, ELECTRONIC DEVICE PROCESSING SYSTEMS, AND PROCESSING METHODS

(71) Applicant: Applied Materials, Inc., Santa Clara, CA (US)

(72) Inventors: Matthew Busche, Santa Clara, CA (US); Wendell Boyd, Jr., Morgan Hill, CA (US); Dmitry A. Dzilno, Sunnyvale, CA (US); Vijay D. Parkhe, San Jose, CA (US); Michael R. Rice, Pleasanton, CA (US); Leon Volfovski, Pacifica, CA (US)

(73) Assignee: Applied Materials, Inc., Santa Clara, CA (US)

( * ) Notice: Subject to any disclaimer, the term of this patent is extended or adjusted under 35 U.S.C. 154(b) by 412 days.

(21) Appl. No.: 14/737,799

(22) Filed: Jun. 12, 2015

(65) Prior Publication Data
US 2016/0007411 A1    Jan. 7, 2016

Related U.S. Application Data

(60) Provisional application No. 62/020,370, filed on Jul. 2, 2014.

(51) Int. Cl.
*F24C 7/00* (2006.01)
*F21V 9/00* (2018.01)
(Continued)

(52) U.S. Cl.
CPC ..... *H05B 3/0047* (2013.01); *H01L 21/67103* (2013.01); *H01L 21/67248* (2013.01); *H05B 1/0233* (2013.01)

(58) Field of Classification Search
None
See application file for complete search history.

(56) References Cited

U.S. PATENT DOCUMENTS

| | | | |
|---|---|---|---|
| 4,702,547 A | 10/1987 | Enochs | |
| 5,425,831 A | 6/1995 | Grimes et al. | |

(Continued)

FOREIGN PATENT DOCUMENTS

| | | |
|---|---|---|
| EP | 0458388 | 11/1991 |
| JP | 2003-161845 | 6/2003 |
| KR | 10-2007-0096958 | 10/2007 |

OTHER PUBLICATIONS

International Search Report and Written Opinion of International Application No. PCT/US2015/035500 dated Sep. 11, 2015.

(Continued)

*Primary Examiner* — Thor Campbell
(74) *Attorney, Agent, or Firm* — Dugan & Dugan, PC

(57) ABSTRACT

Substrate temperature control apparatus including groove-routed optical fibers. Substrate temperature control apparatus includes upper and lower members including grooves in one or both, and a plurality of optical fibers routed in the grooves. In one embodiment, the optical fibers are adapted to provide light-based pixelated heating. In another embodiment, embedded optical temperature sensors are adapted to provide temperature measurement. Substrate temperature control systems, electronic device processing systems, and methods including groove-routed optical fiber temperature control and measurement are described, as are numerous other aspects.

20 Claims, 10 Drawing Sheets

(51) Int. Cl.
  *F26B 3/30* (2006.01)
  *H05B 3/00* (2006.01)
  *H01L 21/67* (2006.01)
  *H05B 1/02* (2006.01)

(56) References Cited

U.S. PATENT DOCUMENTS

| | | | |
|---|---|---|---|
| 5,500,556 A | 3/1996 | Kosugi | |
| 5,699,461 A | 12/1997 | Minemoto et al. | |
| 5,838,121 A | 11/1998 | Fairbairn et al. | |
| 6,379,095 B1 | 4/2002 | Elliot et al. | |
| 6,535,685 B1 | 3/2003 | Tullis | |
| 6,582,175 B2 | 6/2003 | Cox et al. | |
| 7,519,252 B2 | 4/2009 | Morita | |
| 7,927,062 B2 | 4/2011 | Rice et al. | |
| 8,016,542 B2 | 9/2011 | Cox et al. | |
| 8,226,769 B2 * | 7/2012 | Matyushkin | H01L 21/67109 118/725 |
| 9,196,514 B2 | 11/2015 | Parkhe et al. | |
| 9,224,583 B2 * | 12/2015 | Povolny | C23C 16/4586 |
| 9,698,041 B2 * | 7/2017 | Busche | H01L 21/67248 |
| 2003/0062359 A1 * | 4/2003 | Ho | H01L 21/67103 219/444.1 |
| 2008/0019657 A1 * | 1/2008 | Maitland | G02B 6/0008 385/140 |
| 2008/0247739 A1 | 10/2008 | Sohtome | |
| 2009/0111276 A1 | 4/2009 | Dhindsa et al. | |
| 2010/0178146 A1 | 7/2010 | Kremerman et al. | |
| 2010/0178147 A1 | 7/2010 | Kremerman et al. | |
| 2010/0267173 A1 | 10/2010 | Moffatt | |
| 2011/0024047 A1 * | 2/2011 | Nguyen | C23C 14/564 156/345.51 |
| 2015/0045961 A1 * | 2/2015 | Koshti | H01L 21/67248 700/276 |
| 2015/0070814 A1 * | 3/2015 | Parkhe | H01L 21/67109 361/234 |

OTHER PUBLICATIONS

Busche et al., U.S. Appl. No. 14/738,448 titled: "Apparatus, Systems, and Methods for Temperature Control of Substrates Using Embedded Fiber Optics and Epoxy Optical Difffusers," filed Jun. 12, 2015.

Busche et al., U.S. Appl. No. 14/299,850 titled: "Substrate Temperature Control Apparatus Including Optical Fiber Heating, Substrate Temperature Control Systems, Electronic Device Processing Systems, and Methods," filed Jun. 9, 2014.

International Preliminary Report on Patentability of International Application No. PCT/US2015/035500 dated Jan. 12, 2017.

* cited by examiner

ND PROCESSING METHODS

RELATED APPLICATION

The present application is related to, and claims priority from, U.S. Patent Application No. 62/020,370, filed on Jul. 2, 2014, entitled "TEMPERATURE CONTROL APPARATUS INCLUDING GROOVE-ROUTED OPTICAL FIBER HEATING, SUBSTRATE TEMPERATURE CONTROL SYSTEMS, ELECTRONIC DEVICE PROCESSING SYSTEMS, AND PROCESSING METHODS," which is hereby incorporated herein by reference in its entirety for all purposes.

FIELD

The present invention relates to apparatus adapted for use in electronic device manufacturing, and more specifically to apparatus and systems for controlling substrate temperature during high-temperature substrate processing.

BACKGROUND

Conventional electronic device manufacturing systems may include one or more process chambers. In some electronic device manufacturing systems, the one or more process chambers may be arranged around a mainframe housing having a transfer chamber and one or more load lock chambers. These systems may employ one or more process chambers that may perform a process on a substrate (e.g., a wafer) inserted into the process chamber. Processing may include a chemical vapor deposition (CVD) process, such as plasma-enhanced chemical vapor deposition (PECVD) process, used to deposit a thin film on a substrate or other high-temperature process. During processing, wafers may rest on a pedestal (e.g., a substrate support) and the temperature thereof may be controlled (e.g., heated or cooled) at one or more times during the process. Conventionally, heating may be provided by resistive heaters provided within the pedestal in some embodiments.

It should be recognized, however, that even small variations in temperature across the substrate during such high-temperature processing may cause differential processing (e.g., possibly uneven deposition).

Accordingly, apparatus, systems, and methods providing improved temperature control in high-temperature processing of substrates, especially in PECVD processing, are desired.

SUMMARY

In one aspect, a substrate temperature control apparatus is provided. The substrate temperature control apparatus includes a lower member, an upper member proximate to the lower member, a plurality of grooves formed in one or more of the upper member and the lower member, and a plurality of optical fibers adapted to provide light-based heating extending within the grooves.

In another aspect, a substrate temperature control system is provided. The substrate temperature control system includes an optical heating system including a substrate temperature control apparatus including a upper member and a lower member, and a plurality of optical fibers extending laterally in a plurality of grooves, a plurality of light sources coupled to at least some of the plurality of optical fibers, and an optical controller adapted to control light intensity in the plurality of optical fibers.

In another aspect, an electronic device processing system is provided. The electronic device processing system includes a process chamber adapted to carry out a process on a substrate, a substrate temperature control apparatus within the process chamber, the substrate temperature control apparatus including a lower member and an upper member adapted to be in thermal contact with the substrate, and a plurality of optical fibers extending laterally in a plurality of grooves, and a temperature controller coupled to the plurality of optical fibers and adapted to control light intensity in the plurality of optical fibers to provide temperature control of the thermal contact member.

In another aspect, a method of processing substrates is provided. The method includes providing a substrate temperature control apparatus including a lower member, an upper member proximate to the lower member, and a plurality of optical fibers extending laterally in grooves, and controlling light intensity provided to at least some of the plurality of optical fibers to accomplish light-based temperature control of the upper member.

In another aspect, a substrate temperature control apparatus is provided. The substrate temperature control apparatus includes a lower member, an upper member proximate to the lower member, a plurality of grooves formed in one or more of the upper member and the lower member, and a plurality of optical fibers extending within the grooves.

Numerous other aspects are provided in accordance with these and other embodiments of the invention. Other features and aspects of embodiments of the present invention will become more fully apparent from the following description, the appended claims, and the accompanying drawings.

BRIEF DESCRIPTION OF THE DRAWINGS

Persons skilled in the art will understand that the drawings, described below, are for illustrative purposes only. The drawings are not necessarily drawn to scale and are not intended to limit the scope of this disclosure in any way.

DESCRIPTION

Within electronic device manufacturing systems adapted to process substrates at high temperature, very precise temperature control may be desired. In some electronic device manufacturing systems, such as PECVD systems, the systems are configured and adapted to operate at operating temperatures above 500° C., at above 600° C., and even as high as 650° C. may be desired. Various methods have been employed that utilize zoned resistive heating to accomplish temperature control. However, such systems, in general, may lack sufficient temperature control.

According to one or more embodiments of the invention, electronic device processing systems including substrate temperature control apparatus adapted to provide improved substrate temperature control during high temperature processing are provided. The apparatus, systems, and methods described herein may provide improved temperature control by providing a temperature-controlled platform adapted to thermally control a temperature of a substrate at high temperature, such as above 500° C., above 600° C., and even at about 650° C.

In some embodiments, the substrate temperature control apparatus may include a temperature-controlled platform and may include multiple optical fibers routed within grooves formed therein. The optical fibers enter in one or more bundles and extend (e.g., laterally) within grooves and terminate at multiple desired locations within the platform. The multiple optical fibers may be used to provide individually-controllable pixelated heat sources, or optionally, the pixelated sources may be zonally controlled. The optical fiber heating may be used alone as a primary heat source, or as a supplement to other forms of temperature control, such as resistive heating. Including optical fiber heating may provide improved range and flexibility of temperature tuning.

Further details of example substrate temperature control apparatus, substrate temperature control systems including groove-routed optical fiber heating, electronic device processing systems, and methods are described with reference to FIGS. 1-7 herein.

Figure 1:
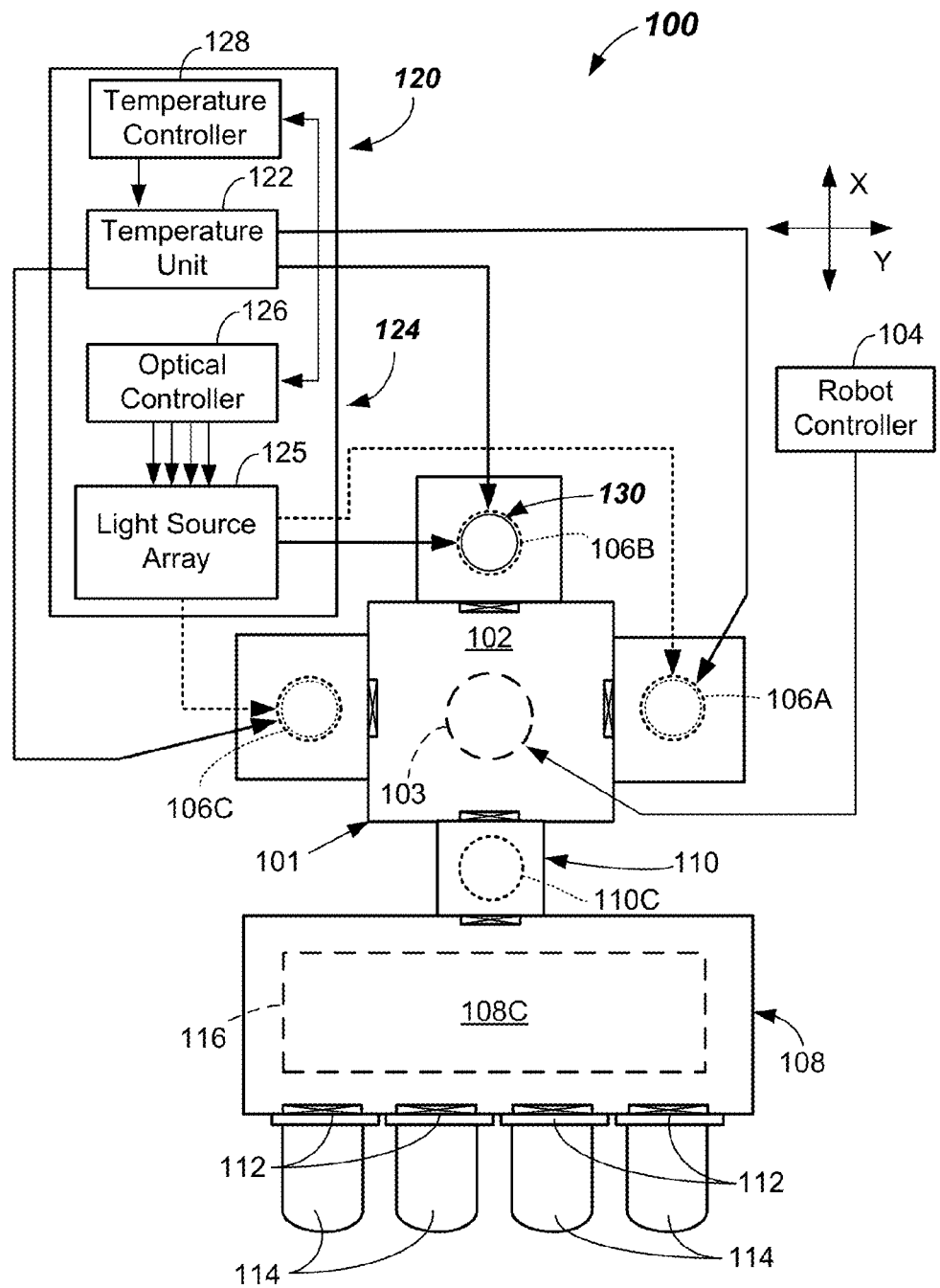
FIG. 1 illustrates a schematic top view of an electronic device processing system including optical fiber heating in one or more process chambers according to embodiments.

FIG. 1 illustrates a schematic top view diagram of an example embodiment of an electronic device processing system 100 including optical fiber heating according to one or more embodiments of the present invention. The electronic device processing system 100 may include a housing 101 having walls defining a transfer chamber 102. Walls may include side walls, floor, and ceiling, for example. A robot 103 (shown as a dotted circle) may be at least partially housed within the transfer chamber 102. The robot 103 may be configured and adapted to place or extract substrates to and from various destinations via operation of moveable arms of the robot 103. "Substrates" as used herein shall mean articles used to make electronic devices or electrical circuit components, such as silicon-containing wafers or articles, patterned or masked silicon wafers or articles, or the like. However, the apparatus, systems, and methods described herein may have broad utility wherever high-temperature control of a substrate is desired. Embodiments of the invention may be useful for controlled high-temperature heating, such as above 500° C., above 600° C., about 650° C., or even higher temperatures.

Robot 103, in the depicted embodiment, may be any suitable type of robot adapted to service the various chambers that are coupled to, and accessible from, the transfer chamber 102. Robot 103 may be a selective compliance assembly robot arm (SCARA) robot or other suitable robot type. For example, robots 103, such as are disclosed in U.S. Pat. No. 5,838,121, U.S. Pat. No. 6,582,175, U.S. Pat. No. 6,379,095, U.S. Pat. No. 7,927,062, U.S. Pat. No. 8,016,542, and US Pat. Pub. 2010/0178147, and US 2010/0178146, may be used. Other robot types may be used.

The motion of the various arms of the robot 103 may be controlled by suitable commands to a drive assembly (not shown) containing a plurality of drive motors from a robot controller 104. Signals from the robot controller 104 may cause motion of the various components of the robot 103 to cause movement of substrates between the process chambers 106A-106C and one or more load lock chambers 110C. Suitable feedback mechanisms may be provided for one or more of the components by various sensors, such as position encoders, or the like. The robot 103 may include a base that is adapted to be attached to a wall (e.g., a floor or ceiling) of the housing 101. Arms of the robot 103 may be adapted to be moveable in an X-Y plane (as shown) relative to the housing 101. Any suitable number of arm components and end effectors (sometimes referred to as "blades") adapted to carry the substrates may be used.

Additionally, the drive assembly of the robot 103 may include Z-axis motion capability in some embodiments. In particular, vertical motion of the arms along the vertical direction (into and out of the paper in FIG. 1) may be provided so as to place and pick substrates to and from the process chambers 106A-106C and the one or more load lock chambers 110C.

In the depicted embodiment, transfer chamber 102 may have one or more process chambers 106A-106C coupled to and accessible therefrom, at least some of which are adapted to carry out high-temperature processing on the substrates inserted therein. The process chambers 106A-106C may be coupled to facets of the housing 101, and each process chamber 106A-106C may be configured and operable to carry out a suitable process (e.g. a PECVD process) on the substrates. It should be understood that the substrate temperature control apparatus 130 including groove-routed optical fiber heating described herein may have utility for other processes taking place at high temperature, such as physical vapor deposition and ion implant, or the like. In particular, one or more of the processes taking place in the process chambers 106A-106C may include temperature control via groove-routed optical fiber heating in accordance with an aspect of the invention.

Within the electronic device processing system 100, substrates may be received from a factory interface 108, and also exit the transfer chamber 102 into the factory interface 108 through load lock chamber 110C of a load lock apparatus 110. The factory interface 108 may be any enclosure having wall surfaces forming the factory interface chamber 108C. One or more load ports 112 may be provided on some surfaces of the factory interface 108 and may be configured and adapted to receive (e.g., dock) one or more substrate carriers 114 (e.g., front opening unified pods—FOUPs) such as at a front surface thereof.

Factory interface 108 may include a suitable load/unload robot 116 (shown dotted) of conventional construction within a factory interface chamber 108C. The load/unload robot 116 may be configured and operational to extract substrates from the interior of the one or more substrate carriers 114 and feed the substrates into the one or more load lock chambers 110C of load lock apparatus 110.

In accordance with one or more embodiments of the invention, a substrate temperature control apparatus 130 may be provided in one or more of the process chambers 106A-106C. As will be apparent from the following, groove-routed optical fiber heating adapted to provide light-based heating of a substrate may be provided by the substrate temperature control apparatus 130. The description herein will focus on providing the substrate temperature control apparatus 130 in process chamber 106B. However, an identical substrate temperature control apparatus 130 may be included in one or both of the other process chambers 106A, 106B. In some embodiments, the substrate temperature control apparatus 130 may be included in all process chambers 106A-106C. More or less numbers of process chambers including the substrate temperature control apparatus 130 may be provided.

Figure 2:
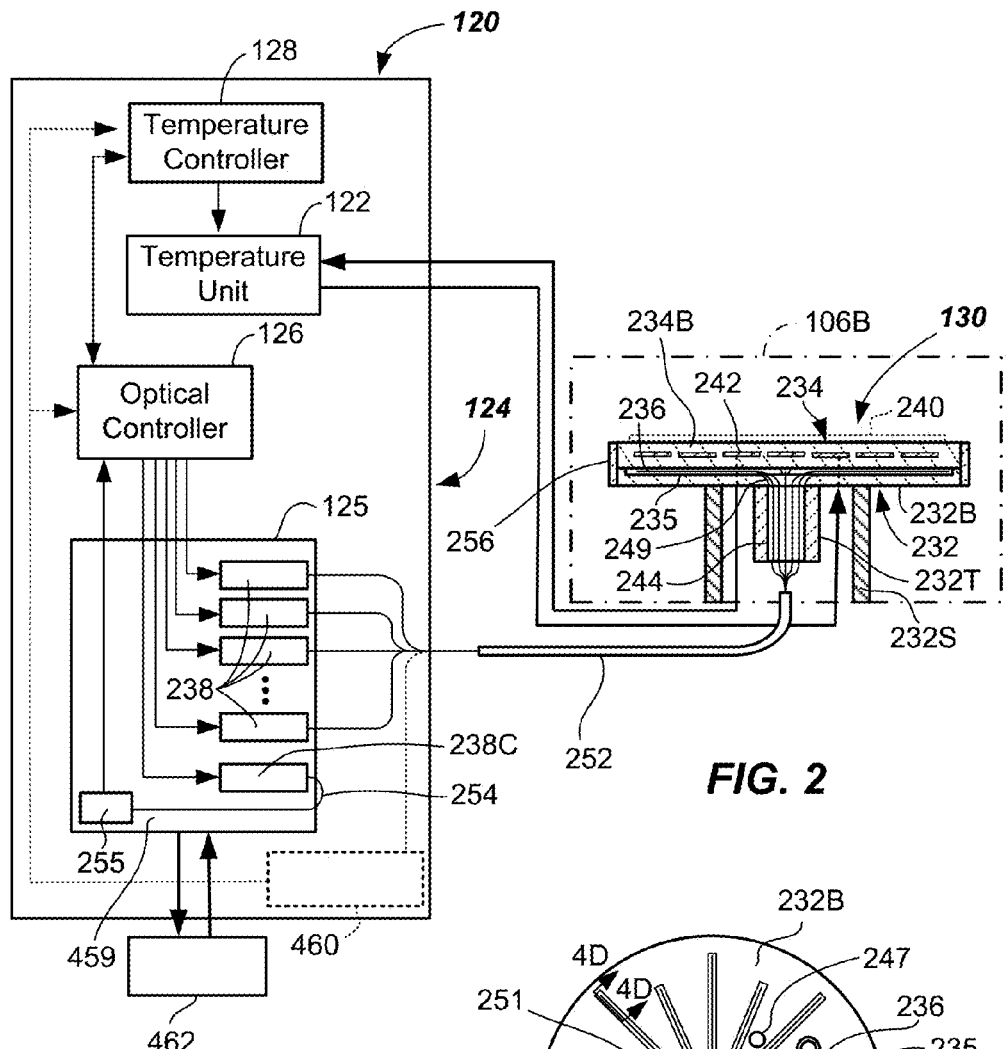
FIG. 2 illustrates a schematic partially cross-sectioned view of a substrate temperature control system including optical fiber heating, wherein the optical fibers are laid in grooves according to embodiments.

Referring now to FIGS. 1 and 2, in some embodiments, a temperature unit 122 that may be coupled to one or more thermal elements 242 (e.g., resistive heating elements) may be used in conjunction with groove-routed optical fiber heating provided by the substrate temperature control apparatus 130 to control a temperature of one or more portions of a substrate 240 to a desired temperature.

At a system level, the temperature control may be provided, in the depicted embodiment, by a substrate temperature control system 120. Substrate temperature control system 120 may be subpart of the electronic device processing system 100. Substrate temperature control system 120 may include the temperature unit 122 that may couple and provide power to the thermal elements 242 (e.g., metal resistive heating elements or traces) and which may constitute a primary source of temperature control (e.g., heating) to one or more of the chambers (e.g., process chambers 106A, 106B, 106C).

An optical heating system 124 may operate as a supplemental heating system in conjunction with the temperature unit 122 and thermal elements 242 in some embodiments. In other embodiments, the optical heating system 124 may be the only heating system adapted to heat the substrates 240 within the one or more process chambers 106A-106C.

Optical heating system 124 may include a light source array 125 coupled (e.g., optically coupled) to the substrate temperature control apparatus 130, and an optical controller 126. Substrate temperature control system 120 may include a temperature controller 128 operational to control temperature of the substrate 240 that is being temperature controlled within the chamber (e.g., process chamber 106B). Temperature controller 128 may be operational to control the temperature unit 122 and may interface with the optical controller 126 in some embodiments. Thus, the temperature controller 128 may be used to communicate with the optical controller 126 and the temperature unit 122 to control a temperature of the substrate 240 in thermal contact with the substrate temperature control apparatus 130. Suitable temperature feedback may be provided from one or more locations. In some embodiments, the temperature controller 128 and/or the optical controller 126 may receive temperature feedback from optical sensors embedded in the substrate temperature control apparatus 130, as will be explained further herein.

Figure 3:
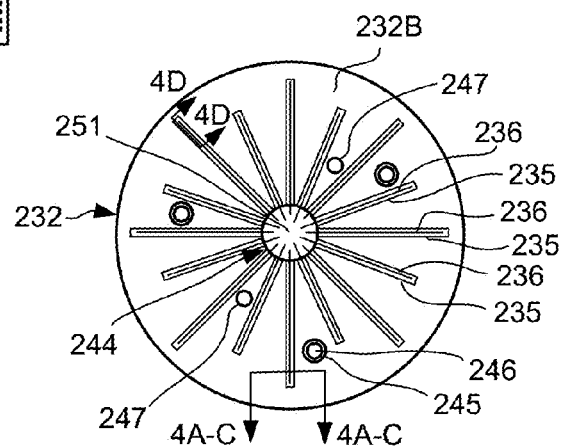
FIG. 3 illustrates a schematic top view of a portion of a substrate temperature control apparatus with the upper member removed to show positioning of the optical fibers within grooves (e.g., spokes) according to embodiments.

Now referring to FIGS. 2 and 3, the substrate temperature control apparatus 130, which is included in optical heating system 124, is described in more detail. Optical heating system 124 may include a substrate temperature control apparatus 130, which may include a platform on which a substrate 240 (shown dotted) may rest or be in thermal contact with. Substrate temperature control apparatus 130, as shown, includes a lower member 232, and an upper member 234 proximate to the lower member 232. A plurality of grooves 235 are formed in one or more of the upper member 234 and the lower member 232. A plurality of optical fibers 236, adapted to provide light-based heating, are routed and extend within grooves 235.

As shown in FIGS. 2 and 3, the grooves 235 may be formed in the lower member 232 only. However, it should be recognized that the grooves 235 may be formed in the upper member 234 or in both the upper member 234 and lower member 232. In the depicted embodiment, the upper member 234 is provided in thermal contact with the substrate 240 to control a temperature thereof.

As shown, the plurality of optical fibers 236 are configured to extend laterally within the grooves 235. Extend laterally, as used herein, means that the length of the optical fiber (along its longitudinal axis) passes horizontally within the grooves 235. Grooves 235 may be oriented to extend substantially parallel to an upper surface plane of the upper member 234. Some slight deviation from parallel is possible due to laying the optical fibers 236 in the grooves 235. The plurality of grooves 235 may be provided in any suitable pattern. One pattern includes a plurality of radial spokes, as shown in FIG. 3. Other suitable groove patterns may be used.

The plurality of optical fibers 236 are adapted to provide light-based heating of the substrate 240. The plurality of optical fibers 236 may terminate at multiple radial locations in the grooves 235 (see FIG. 3, for example). Optical fibers 236 may pass through the lower member 232 as a bundle (e.g., as a group of fibers) and then bend and extend laterally within the grooves 235. Optical heating system 124 may include the light source array 125 including a plurality of light sources 238 coupled to at least some, and preferably most or all, of the plurality of optical fibers 236. The optical controller 126 may be configured to control light power (e.g., intensity) channeled into, and carried by, the plurality of optical fibers 236.

In operation, light carried in at least some of the plurality of optical fibers 236 is used to heat local portions of the underside of the upper member 234, and thus by at least conduction, the substrate 240. When the plurality of optical fibers 236 are bent, positioned and terminated at desired locations, many local portions of the upper member 234 may be heated. In some embodiments, this localized heating may be in conjunction with temperature control provided by the temperature unit 122 and the thermal elements 242. In other embodiments, the localized (e.g. pixelated) heating by the plurality of optical fibers 236 may be the only heating provided to the upper member 234.

For example, temperature control may, in some embodiments, cause the substrate 240 (shown dotted) to be heated to a nominal temperature of greater than about 500° C., greater than about 550° C., greater than about 600° C., or even about 650° C., or a greater temperature. For example, temperature control may, in some embodiments, cause the substrate 240 (shown dotted) to be heated to a nominal temperature of between about 600° C. and about 700° C. Such heating may be carried out on substrates 240 within the one or more process chambers 106A-106C in some embodiments. For example, temperature control may, in some embodiments, cause the substrate 240 (shown dotted) to be heated, such as in a PECVD process.

In some embodiments, the thermal elements 242 may provide a primary heating source to heat the upper member 234 to a nominal temperature, and the substrate temperature control apparatus 130 may provide assistive or supplemental heating sources, such that the nominal temperature may be further adjusted between bounds, such as between about +/−10° C. from a nominal temperature, between about +/−20° C. from the nominal, or even between about +/−30° C. from the nominal, for example. Other temperature adjustment magnitudes may be accomplished by using light sources 238 that are more or less powerful (having more or less light output power). Thus, in accordance with aspects of the invention, temperature control may be implemented by the optical fiber heating on a pixelated basis.

Some of the optical fibers 236 may include various optical features at the fiber termination, including a diffuse emitter, a lensed tip, or an angled cleave. Such optical features may be used to direct light to one or more surfaces of the diffuser or otherwise minimize light reflection back into the optical fiber 236. Such optical features are described more fully in U.S. Provisional Patent Application No. 62/020,367, filed Jul. 2, 2014, and entitled "APPARATUS, SYSTEMS, AND METHODS FOR TEMPERATURE CONTROL OF SUBSTRATES USING EMBEDDED FIBER OPTICS AND EPOXY OPTICAL DIFFUSERS."

Operation of the optical fiber heating will now be described. For example, if the nominal desired temperature of the substrate 240 is about 650° C., but geometrical or thermal anomalies or other differences in the process chamber 106B or the design of the upper member 234 and lower member 232 make it difficult to achieve that nominal temperature across all parts of the substrate 240, then auxiliary heating may be provided by the optical heating system 124 in addition to any heat provided by the temperature unit 122 and coupled thermal elements 242. Auxiliary heating may be provided, in one or more embodiments, by the optical heating system 124 to adjust localized regions in order to meet any desired temperature profile. In some embodiments, optical heating system 124 may be used to adjust localized regions to provide a substantially uniform temperature profile of the substrate 240. However, the desired temperature profile may be made intentionally non-uniform in some embodiments.

It should also be apparent that in some embodiments, the optical heating system 124 may be the only source of heating (i.e., no temperature unit 122 or thermal elements 242 are present). In this embodiment, the optical controller 126 may be the only temperature controller present and may adjust temperature of localized regions by adjusting the light intensity to individual optical fibers 236, either individually or zonally.

In more detail, the lower member 232 may be a ceramic material, such as aluminum nitride (AlN). Lower member 232 may include a lower support body 232B, which may be a planar disc, and may include a transition leg 232T extending downwardly from the lower support body 232B. Lower member 232 may also include a lower member support 232S that extends downwardly from the lower support body 232B and may be used to support the substrate temperature control apparatus 130 within the process chamber 106B. Each of the transition leg 232T and the lower member support 232S may be diffusion bonded to the lower support body 232B or otherwise brazed by use of an active metal braze. Portions of the transition leg 232T may be purged with an inert gas (e.g., nitrogen or another inert gas) to prevent degradation of the optical fibers at high temperature by OH absorption or devitrification.

The lower member 232 may also include one or more passages 244 (e.g., one or more bores) through the lower support body 232B. In the depicted embodiment, a single passage 244 that is centrally located is provided through the lower support body 232B as shown. The passage 244 may extend through the transition leg 232T. Passage 244 may include a radius 249 at its upper end. The radius 249 may be between about 6 mm and 20 mm, for example, and may help reduce bending stresses in the optical fibers 236 as they transition into the grooves 235. The plurality of optical fibers 236 may enter through the one or more passages 244. For example, the plurality of optical fibers 236 may enter as a bundle though the passage 244 and then the one or more optical fibers 236 may be routed into the grooves 235, such as shown in FIG. 3. In some embodiments, a single optical fiber 236 may be received in each groove 235. In other embodiments, multiple optical fibers 236 may be received in some grooves 235 (see FIGS. 6A-6B).

Secondary passages 245 may be included through the lower support body 232B to accommodate lift pins 246, temperature probes, or the like. Additionally or optionally, third passages 247 may be included in some embodiments to pass electrical wires to the thermal elements 242, if present. Third passages 247 may also be used to pass wires to electro-static chuck elements, if present. In some embodiments, multiple passages (like passage 244) may be provided to route bundles of optical fibers 236 into various zones whereas the optical fibers 236 spread out from the multiple passages into one or more grooves emanating therefrom. Any suitable number of passages 244 may be used to pass bundles of optical fibers 236 through the lower member 232.

Once passing through the one or more passage 244, the optical fibers 236 are bent around the radius 249 (e.g., at an approximate 90 degree angle) and extend outwardly (e.g., radially in some embodiments) and are laid in the grooves 235. In some embodiments, the bends or all of a length of the optical fibers 236 in the substrate temperature control apparatus 130 may include annealing so that the bent shape may be retained and bending stresses may be relaxed. Annealing may take place for a sufficient time at between about 800° C. and about 900° C., for example, in a vacuum or inert gas environment to prevent degradation of the optical fibers 236.

Optical fibers 236 may be of various suitable lengths and may extend laterally to various desired termination locations within the grooves 235. Grooves 235 may be of different lengths as shown in FIG. 3, and may have any suitable groove shape. In some embodiments, the grooves 235 may emanate from the one or more passages 244 and be straight, whereas others may emanate from the one or more passages 244 and may be curved, circular, or even serpentine (see FIGS. 5 and 6A). Combinations of straight, curved, circular, and serpentine grooves 235, or straight, curved, circular, and serpentine portions may be used to construct each groove 235.

Figure 4A:
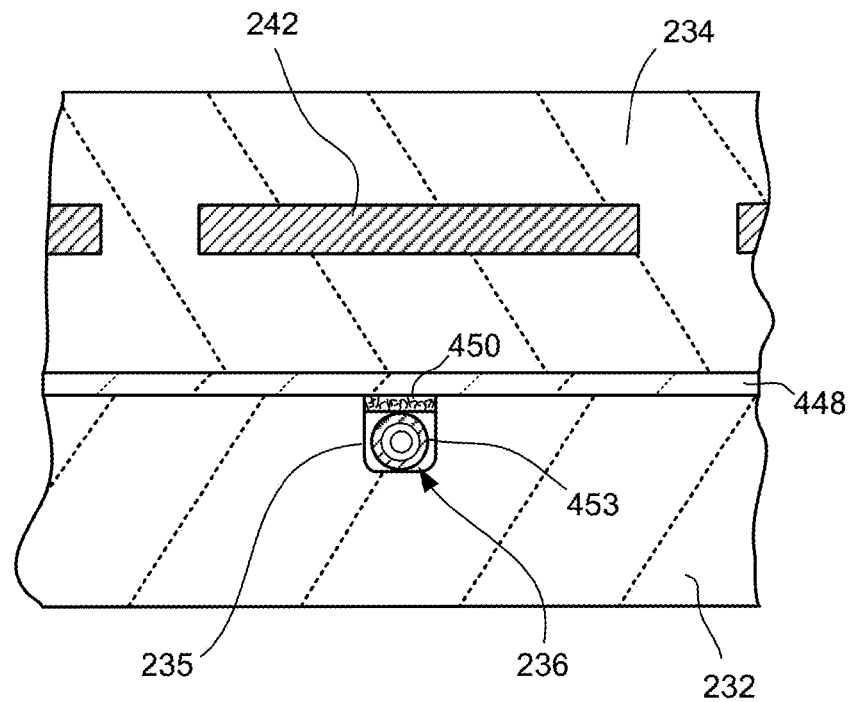
FIG. 4A illustrates an enlarged partial cross-sectioned view of a portion of a substrate temperature control apparatus showing a first embodiment of positioning of an optical fiber within a groove.

Grooves 235 may also have any suitable cross-sectional shape. For example, FIGS. 4A-4C and 4E illustrate various shapes of grooves 235 and methods of routing optical fibers 236 within the grooves 235. FIG. 4A illustrates an enlarged partial cross-sectional view taken along section line 4A-4A in FIG. 3, but including the upper member 234 and a bonding material 448 adapted to bond the upper member 234 to the lower member 232. The shape of the groove 235, as shown, may be generally rectangular in cross-section. However, other cross sectional shapes may be used, such as half round, trapezoidal, or the like. Grooves 235 may be formed in the lower member 232 by any suitable machining means, such as laser machining, abrasive water jet cutting, grinding or milling with diamond tools, and the like. The grooves 235 may be larger in width than a width of the optical fiber 236 so that the optical fiber 236 may not undergo stress due to thermal expansion mismatch. For example, the width of the groove 235 may be about 1 mm greater or more than an outer dimension of the optical fiber 236 or group (e.g., bundle) of optical fibers 236 that are routed within the groove 235. For example, the dimensions of the grooves 235 may be between about 1 mm and 3 mm wide, and between about 1 mm and 3 mm deep. Other dimensions may be used.

The number of grooves 235 may number 20 or more, and between about 50 and 500 in some embodiments, such as when a single optical fiber 236 is received in each groove. In some embodiments, where multiple optical fibers 236 are received in each groove 235, between about 5 and about 50 grooves 235 may be provided. Thus, depending on the design, between about 5 and about 500 grooves may be provided, for example. A coating may be applied to the interior of one or more of the grooves 235 to improve light absorption. For example, a black-colored high temperature coating suitable for high temperature service may be used.

Figure 4B:
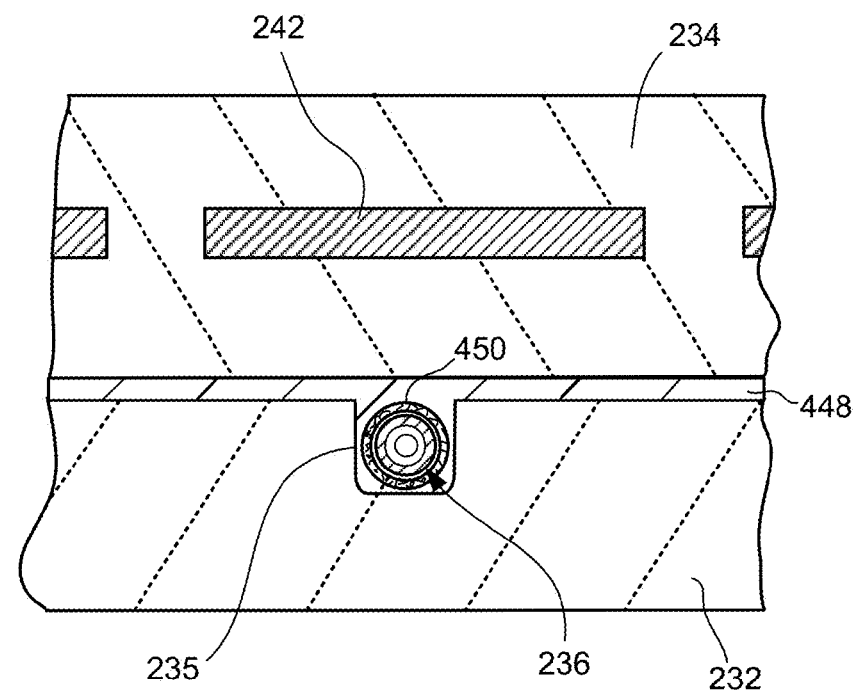
FIG. 4B illustrates an enlarged partial cross-sectioned view of a portion of a substrate temperature control apparatus showing a second embodiment of positioning of an optical fiber with a sheath barrier within a groove.
Figure 4C:
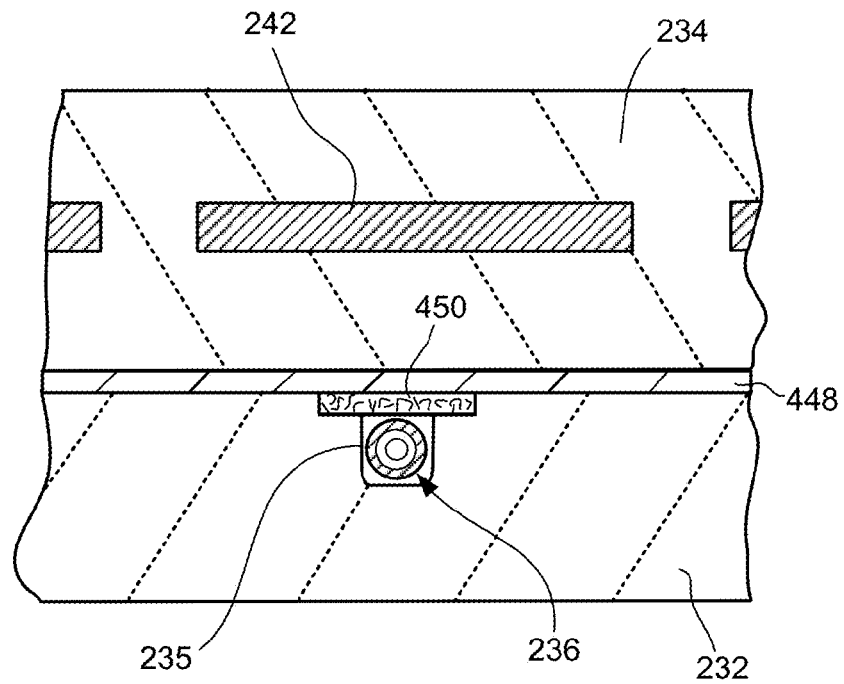
FIG. 4C illustrates an enlarged partial cross-sectioned view of a portion of a substrate temperature control apparatus showing a third embodiment of positioning of an optical fiber within a groove.
Figure 4D:
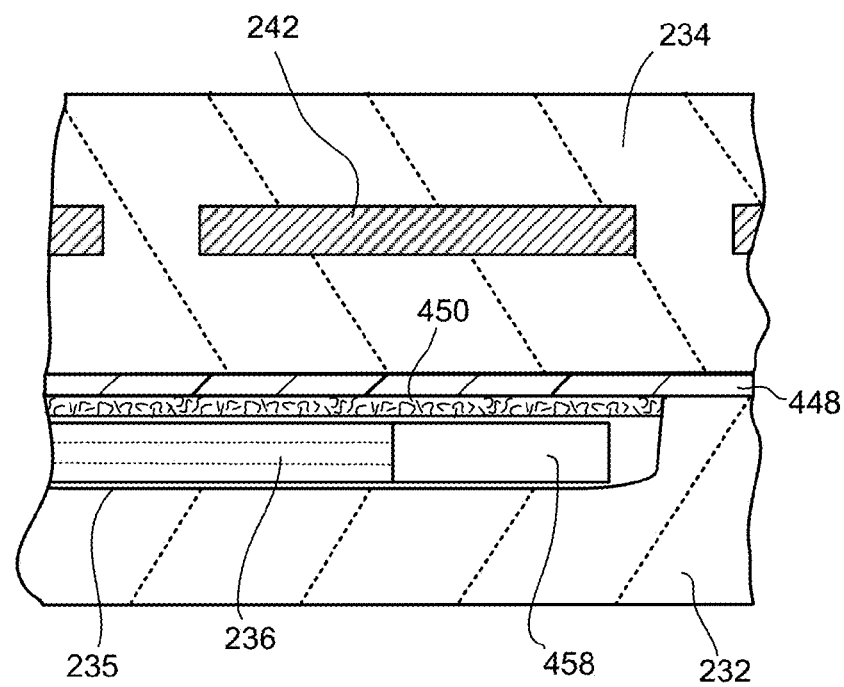
FIG. 4D illustrates an enlarged partial side view of a portion of a substrate temperature control apparatus showing an optical sensor inserted in a groove according to embodiments.
Figure 4E:
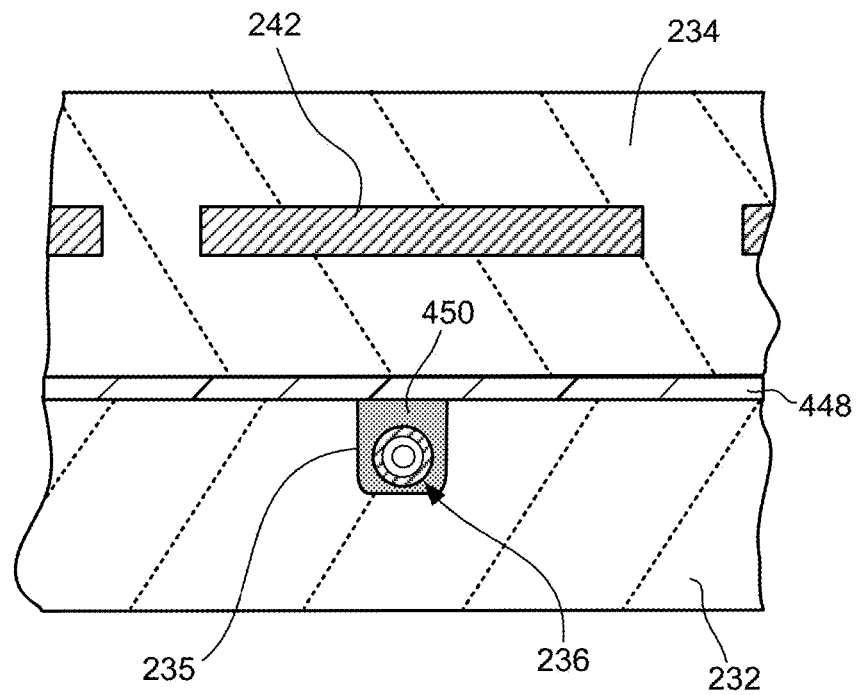
FIG. 4E illustrates an enlarged cross-sectioned partial side view of a portion of a substrate temperature control apparatus showing an optical fiber inserted in and potted in a groove according to embodiments.

In some embodiments, a barrier 450 may be provided between the optical fiber 236 and the bonding material 448. For example, in FIGS. 4A-4C, the barrier 450 may be provided within or on the groove 235 and along a length of the optical fiber 236. In FIG. 4B, the barrier 450 may be provided in the groove 235 and may be a sheath or sleeve of material that may loosely surround the optical fiber 236 along its length. In FIG. 4E, the barrier 450 may be a powder that surrounds at least a portion of the optical fiber 236. The powder may be a silicon carbide powder material. The barrier 450 may be any suitable material that prevents the bonding material 448, which may be a braze foil or glass frit or the like, from coming into contact with the optical fibers 236. This allows the optical fiber 236 to move longitudinally in the groove 235 as the lower member 232 heats up. In one or more embodiments, the barrier 450 may be a woven, braided, or fibrous ceramic cloth or paper. Other materials such as fiberglass or powdered ceramics, such as powdered silicon carbide, may be used. Other suitable high-temperature materials may be used for the barrier 450. Depending upon the configuration used, the barrier 450 and/or the optical fibers 236 may be adhered to the groove 235 or the barrier 450 adhered to or above the groove 235 with a suitable organic adhesive. For example, in some embodiments, an ultraviolet (UV) curable epoxy adhesive may be used to secure the optical fiber 236 in the groove 235. An ultraviolet (UV) curable epoxy adhesive may also be used to secure the barrier 450. It is desired that the organic adhesive be thermally removed during subsequent processing or operation of the substrate temperature control apparatus 130. Other means for securing the optical fibers 236 in the grooves 235 may be used. For example, the optical fibers 236 may be held in place within the grooves 235 by clips, such as metal clips or springs formed from a high temperature metal (e.g., such as Inconel 750). In other embodiments, the optical fibers 236 may be held in place by plastic tubing inserted above the individual optical fiber 236. Tubing may be made of PTFE, which can be pyrolized at a temperature of about 400° C. and about 500° C. In some embodiments, optical fibers 236 may be held in place by plastic shims, or by a hot-melt thermoplastic adhesive such as CRYSTAL-BOND 555 available from Aremco Products Inc. of Valley Cottage, N.Y., which can be removed from the assembly with hot water. In some embodiments, optical fibers 236 may be combined into bundles with heat shrink tubing to ease assembly. The heat shrink tubing may be constructed from PTFE, which can be removed by pyrolization. In some embodiments, optical fibers 236 may be routed to grooves 235 or within the grooves 235 using capillary tubing constructed of a suitable high temperature metal (e.g., metal or metal alloy), for example.

In the depicted embodiment of FIGS. 2 and 3, the optical fibers 236 may pass through the passage 244 as a bundle of optical fibers 236 and may be constrained or fixed within the passage 244. For example, bundle of optical fibers 236 may be potted with a potting material 251 provided within the passage 244, such as with a ceramic adhesive. One suitable ceramic adhesive is CERAMACAST 865 available from Aremco Products Inc. of Valley Cottage, N.Y. Other suitable potting materials may be used. Potting material 251 may be located at a bottom, top, middle, or all along the passage 244. Potting material 251 operates to secure the optical fibers 236 in place in the passage 244. In some embodiments, the bundle of optical fibers 236 may be constrained in a sleeve and/or metal capillary tube. A transition region where the optical fibers 236 bend into the grooves 235 may be covered with a disc-shaped gasket of high temperature material (e.g., a die-punched gasket) of the any of the materials used for the barrier 450. Barrier 450 and the gasket in the transition region may isolate the optical fibers 236 from contact with the bonding material 448.

The upper member 234 may be provided above the lower member 232 and may comprise an upper support body 234B which may have a disc-shape. Upper member 234 may also be a ceramic material, such as an aluminum nitride (AlN) ceramic like the lower member 232. The optical fibers 236 may be laid in the grooves 235 and extend laterally to heat various underside portions of the upper member 234. A suitable bonding material 448, such as a metal braze film or glass frit may be used to bond the upper member 234 and lower member 232 together. In some embodiments where the optical fibers 236 are inserted before bonding, glass frit or a metal braze may be used to join the upper member 234 to the lower member 232. One possible braze is by using a copper-silver braze material, which can be brazed at a temperature of about 850° C. In another example, a glass frit powder may be used. The frit powder may be adjusted by adding fillers and adjusting glass chemistry to match the CTE of the ceramic material used for the upper member 234 and lower member 232 and provide a suitable melting point. Bond thickness of the bonding material 448 may be between about 0.3 mm to about 0.5 mm, for example.

In some embodiments, a radial edge of substrate temperature control apparatus 130 may include a protective layer 256 of an etch-resistant material. The protective layer 256 may be made of any material that resists etching by the gases or other material present within the process chamber 106B. For example, the protective layer 256 may be a Yttrium oxide (Yttria) material, which may be applied by a spraying process (e.g., plasma spraying). Other suitable application processes may be used. The protective layer 256 may offer protection for the layer of bonding material 448, especially from fluorine-based cleaning chemicals that may be used in the process chamber 106B.

The upper member 234 may include the thermal elements 242 imbedded therein. The thermal elements 242 may provide single-zone heating or dual-zone heating in some embodiments, and may be configured vertically above the location of the optical fibers 236, or below the location of the fibers in some embodiments. The thermal elements 242 may provide a majority of the heat and the light-based heating provided by the optical fibers 236 provide localized heating supplements to provide the capability of making local temperature adjustments adjacent to the terminations locations of the optical fibers 236.

In the depicted embodiment of FIGS. 1-2, the optical controller 126 may be any suitable controller having a processor, memory, and peripheral components adapted to execute a closed loop or other suitable control scheme and control the optical power (e.g., Watts) emanating from each of the light sources 238 of the light source array 125. At least some of the light sources 238 are coupled to the optical fibers 236 and provide optical power thereto (e.g., infrared energy). Optical fibers 236 may be arranged in a bundle (as shown) and may include a protective sheath 252 over at least some of the length as they are routed to the lower member 232. Protective sheath 252 may be a flexible stainless steel tube in some embodiments. Other suitable sheath materials may be used.

Optical fibers 236 may include any suitable optical fiber type, such as graded-index optical fiber, step-index single mode optical fiber, multi-mode optical fiber, or even photonic crystal optical fiber. Optical fibers 236 that exhibit relatively high bend resistance may be used. Relatively high numerical aperture (NA) fibers may be used, such as NA of greater than about 0.1, greater than about 0.2, or even greater than about 0.3. Any suitable number of optical fibers 236 may be used, such as 20 or more, 50 or more, 100 or more, 200 or more 300 or more, 400 or more, and even up to 500 or more. The termination of the optical fibers 236 may be located below the upper surface of the upper member 234 by between about 0.125 inch (about 3.2 mm) to about 0.5 inch (12.3 mm). Other vertical locations are possible.

One example with 277 optical fibers 236 coupled to 10 W light sources 238 where the terminations of the optical fibers 236 in the grooves 235 are located at 0.325 inch (8.3 mm) below the upper surface of the upper member 234 provides relatively uniform light-based heating. Optical fibers 236 may be coupled to the respective light sources 238 by any suitable conventional coupling means.

As shown in FIG. 4A, the optical fibers 236 may each include a metal film 453 on an outer surface. Depending on the operating temperature, aluminum, copper or gold may be used for the metal film 453. At temperature around 650° C., gold may be used for the metal film 453. The metal film 453 may be about 15 microns thick, for example. Other thicknesses may be used.

The optical fibers 236 that extend to the lower member 232 in the protective sheath 252 from the light source array 125 may comprise standard polymer-coated optical fibers (e.g., acrylate or acrylate-epoxy polymer coating). The optical fibers 236 may be spliced to the polymer-coated fibers at a point below the transition 2321, for example.

In some embodiments, one or more of the light sources 238C may be coupled by a sensor fiber 254 to a control sensor 255, such as a light receiver (e.g., photodiode). Each light source 238 may be a laser diode, such as a single emitter diode. The laser diode may have any suitable output wavelength range, such as between about 915 nm and about 980 nm, for example. Other output ranges may be used. Output power may be modulated between about 0 W to about 10 W. However, ever higher power diodes (e.g., >10 W) may be used. The laser diode may include an optical fiber output having a 105 or 110 micron core diameter, for example. For example, a model PLD-10 from IPG Photonics of Oxford, Mass. may be used. Other types of light sources 238 may be alternatively used. According to embodiments, between about 20 and about 500 light sources 238 may be used. As shown, the light sources 238 may be rest upon or be in thermal engagement with a common heat sink 459, which may be cooled (e.g., liquid cooled) to between about 20° C. and about 30° C. by a cooling source 462. Cooling source 462 may be a source of chilled water, for example. Other types of cooling sources 462 may be used.

A control sensor 255 may be used to provide feedback to the optical controller 126 on a relative output of a control light source 238C (e.g., of light intensity or heat generation, for example). Optionally or in addition, and as shown in FIG. 4D, one or more optical temperature sensors 458 may be provided in one or more of the grooves 235 and coupled to a temperature measuring system 460 to enable localized temperature monitoring of an inside portion of the substrate temperature control apparatus 130. For example, the optical temperature sensor 458 may be a fiber Bragg grating coupled to a spectrometer, which may be the temperature measuring system 460. A fiber multiplexer or other like component may be used to connect multiple optical temperature sensors 458 to a single spectrometer. An optical temperature sensor 458 may also be accomplished by other suitable means, such as by embedding a tip of an optical fiber in a suitable adhesive material (e.g., CERAMACAST 865 available from Aremco Products Inc. of Valley Cottage, N.Y.) and measuring the thermal radiation emitted by that material. Thermal measurement may be accomplished by coupling the optical fiber to an indium gallium arsenide photodiode. The optical fibers coupled to the optical temperature sensor 458 may also be placed in a groove 235. Any suitable temperature measuring system 460 may be used to interrogate the optical temperature sensor 458. Temperature measuring system 460 may interface with the temperature controller 128 and/or the optical controller 126 to provide temperature feedback. Optionally or additionally, thermal feedback by other methods, such as two or more RTDs on the substrate temperature control apparatus 130 may be used.

Figure 4F:
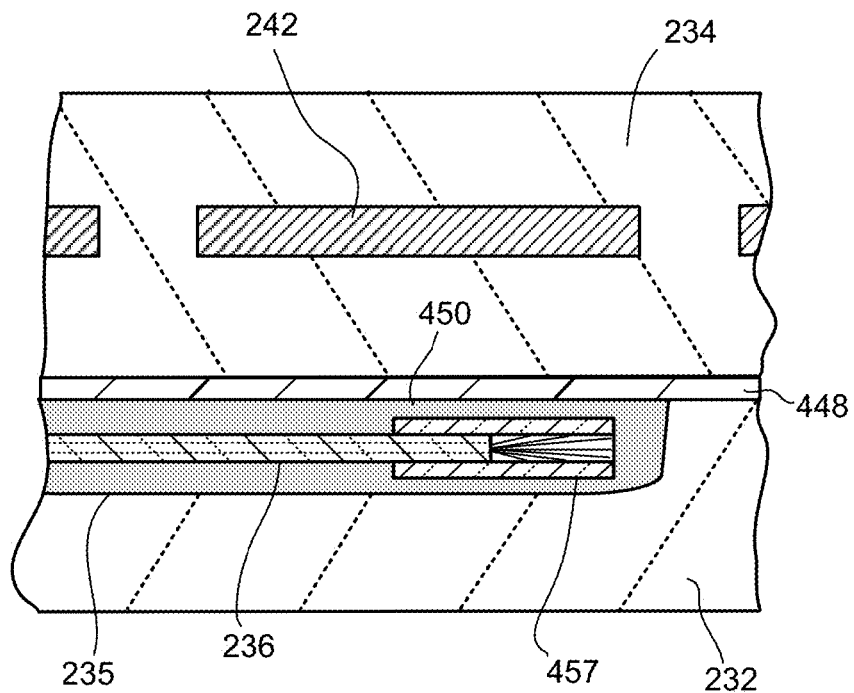
FIG. 4F illustrates an enlarged cross-sectioned partial side view of a portion of a substrate temperature control apparatus showing an optical fiber inserted in a groove and terminated at a silica capillary tube according to embodiments.
Figure 4G:
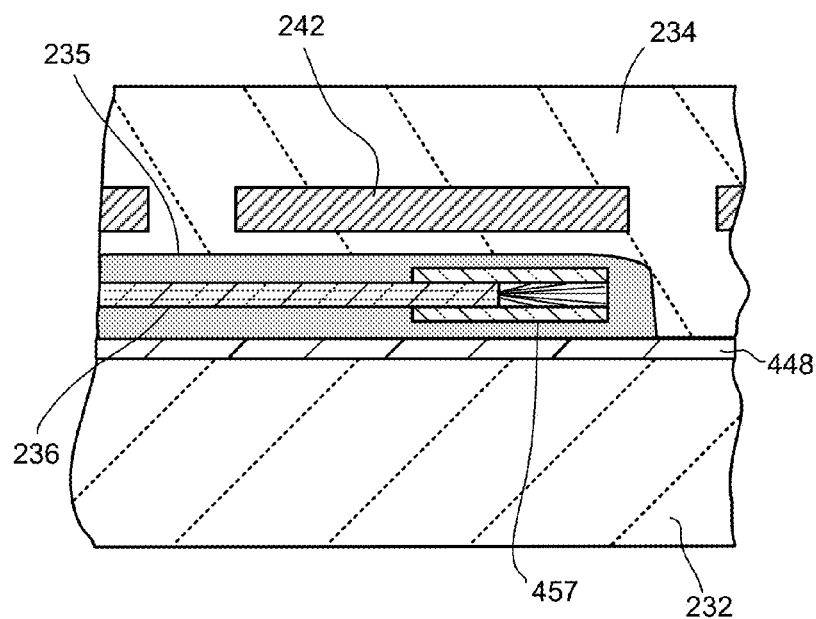
FIG. 4G illustrates an enlarged cross-sectioned partial side view of a portion of a substrate temperature control apparatus showing an optical fiber inserted in a groove formed in an upper member according to embodiments.

Each light source 238 may be individually controlled and modulated from a low or zero level of optical power output to a high or maximum level of optical power output. Each light source 238 may be individually controlled in order to control temperature at finite points (pixels) or collectively controlled in groups of optical fibers to control temperatures of one or more regions or zones of the substrate temperature control apparatus 130. As shown in FIG. 4F, the optical fiber 236 may be provided in one or more of the grooves 235 formed in the lower member 232. One or more of the optical fibers 236 may terminate at a diffuser 457. The diffuser 457 enables the transmitted light to be spread over a larger surface area than the surface area of the end of the optical fiber 236. Diffuser 457 may be a transparent or translucent tube such as a fused silica containing tube into which an end of the optical fiber 236 may be inserted or otherwise spliced. Other suitable diffusers devices may be used. FIG. 4G illustrates another embodiment where the optical fibers 236 are received in grooves 235 formed in the upper member 234. Any of the systems described herein can be implemented with fibers received in grooves 235 formed in either the upper member 234 or the lower member 232.

Any suitable temperature control philosophy may be implemented. In one control aspect, a highly uniform temperature distribution across an upper surface of the substrate 240 may be sought. In another aspect, a deliberately non-uniform temperature distribution may be desired (e.g., hotter or cooler at an edge of the substrate 240). Each temperature profile may be provided, as desired, in accordance with aspect of the invention depending on the control philosophy implemented by the optical controller 126. Some embodiments of the invention may therefore provide azimuthal temperature variations.

Figure 5:
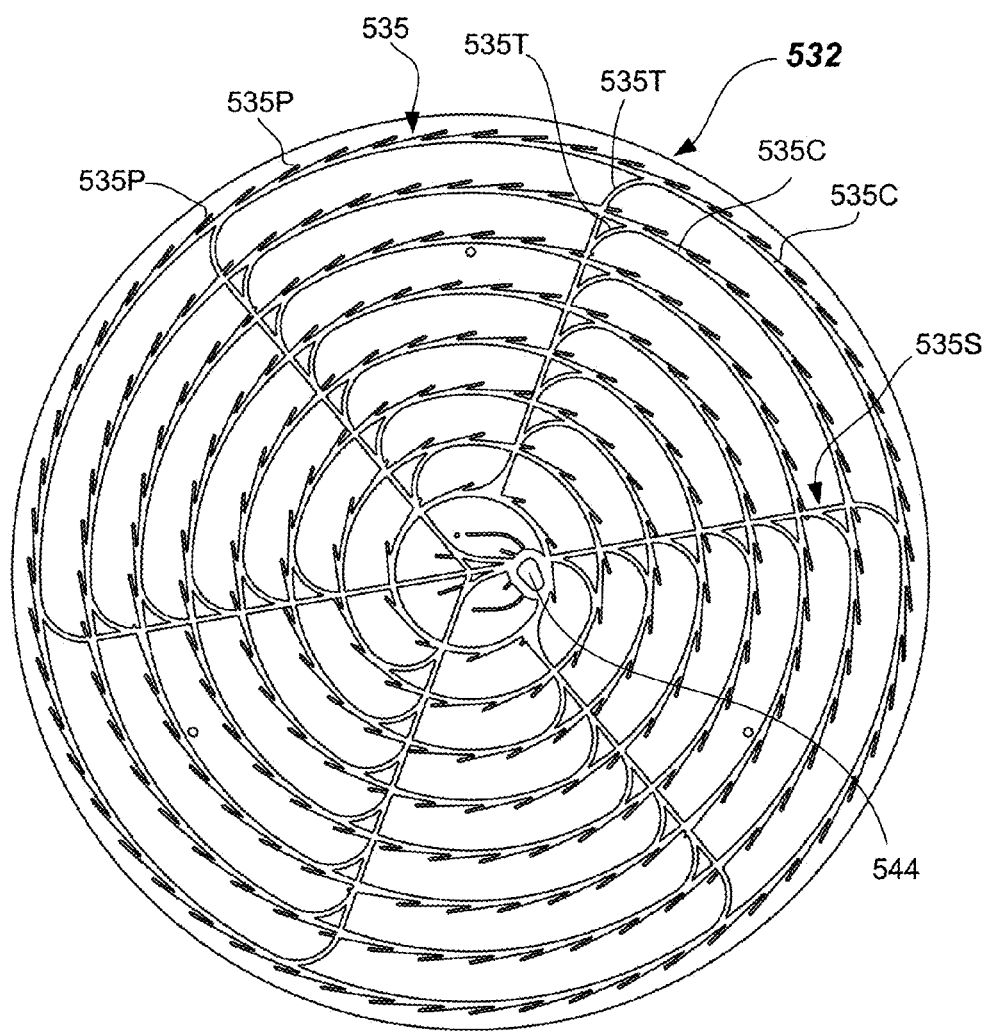
FIG. 5 illustrates a schematic top plan view of a portion of a substrate temperature control apparatus according to embodiments with the upper member removed to show patterns of various grooves.

Referring now to FIG. 5, another embodiment of the lower member 532 including a plurality of grooves 535 formed in a pattern and interconnecting to a passage 544 is shown. Optical fibers (not shown) of pre-measured length may be fed as a bundle through the passage 544 and routed within and positioned into place (e.g., laid and at least temporarily adhered) in the plurality of grooves 535. The plurality of grooves 535 may be provided in a pattern including at least some radial spokes 535S. Radial spokes 535S may emanate from at or near the passage 544 and extend radially outward therefrom. In some embodiments, the radial spokes 535S may not be straight, but may include a curvature thereon. In some embodiments, the radial spokes 535S may depart from a purely radial orientation, and may be angled by as much as 60 degrees therefrom. Six radial spokes 535S are shown, but more or less numbers of radial spokes 535S may be used.

In another aspect, the plurality of grooves 535 may be provided in a pattern including one or more of circular groove sections 535C that may be either partial or full circles. A plurality of full circles as circular groove sections 535C are shown in FIG. 5. The circular groove sections 535C may be concentric, as shown, in some embodiments. Eight circular groove sections 535C are shown, but more or less numbers of circular groove sections 535C may be used.

As shown in FIG. 5, when the plurality of grooves 535 include a pattern having both a plurality of radial spokes 535S and circular groove sections 535C, then transition grooves 535T may be provided. Transition grooves 535T may have a radius of greater than about 15 mm to allow for a smooth transition from the radial spokes 535S to the circular groove sections 535C. Each of the grooves 535 may terminate in a groove pocket 535P (a few labeled) and the optical fibers (not shown) may be cleaved to a length where the termination ends within the groove pocket 535P. This aids in precisely locating the terminations.

Figure 6A:
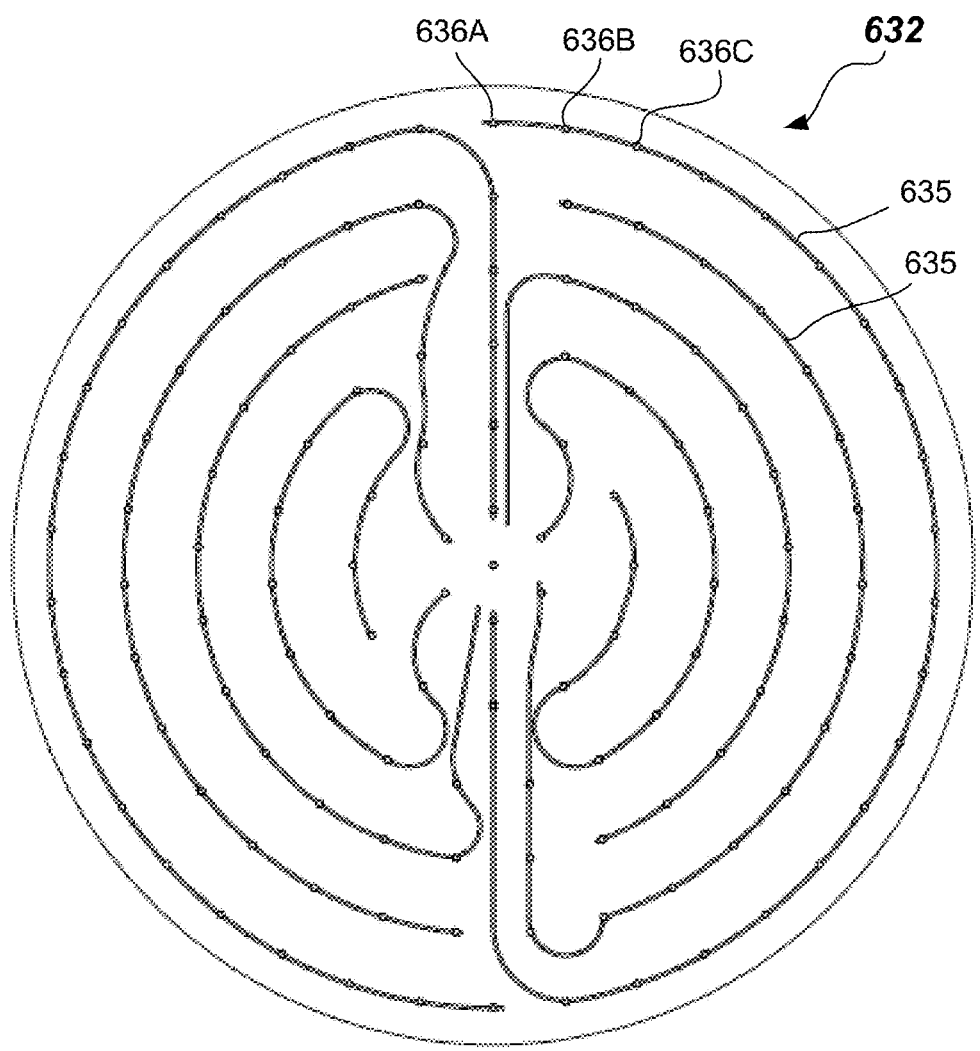
FIG. 6A illustrates a schematic top plan view of a portion of a substrate temperature control apparatus according to embodiments with the upper member removed to show serpentine configuration of the various grooves.

FIG. 6A illustrates a top view of another embodiment of the lower member 632 including grooves 635 formed therein. Grooves 635 comprise serpentine paths as shown, but the grooved paths can be of any shape. The grooves 635 are shown machined in the lower member 632. These grooves 635 start at near center and intersect desired "pixel" locations as they move outward. Eight grooves 635 are shown, but the number of grooves 635 may be more or less, depending on the number of desired "pixel" locations.

As shown in partial side view of FIG. 6A, optical fibers 636A, 636B, 636C, etc. may be inserted into the grooves 635 after the upper member 234 has been bonded to the lower member 632. Because the optical fibers 636A, 636B, 636C, etc. are not installed at the time of bonding the upper member 234 to the lower member 632, higher temperature bonding processes may be used (e.g., diffusion bonding process). Diffusion bonding takes place around 1800° C., which is above the melting temperature of the optical fibers (about 1600° C.), and may provide a higher bond strength. Metal capillary tubes may be inserted from the bottom of the lower member 632 and intersect with the grooves 635. These capillary tubes provide a conduit to assist in routing the fiber assemblies 665 into the grooves 635. Capillary tubes may be adhered to the lower member 632 by a suitable high-temperature adhesive.

In some embodiments where the optical fibers 636A, 636B, 636C, etc. are inserted after bonding, glass frit or an active metal braze as discussed above may be used to join the upper member 234 to the lower member 632.

Figure 6B:
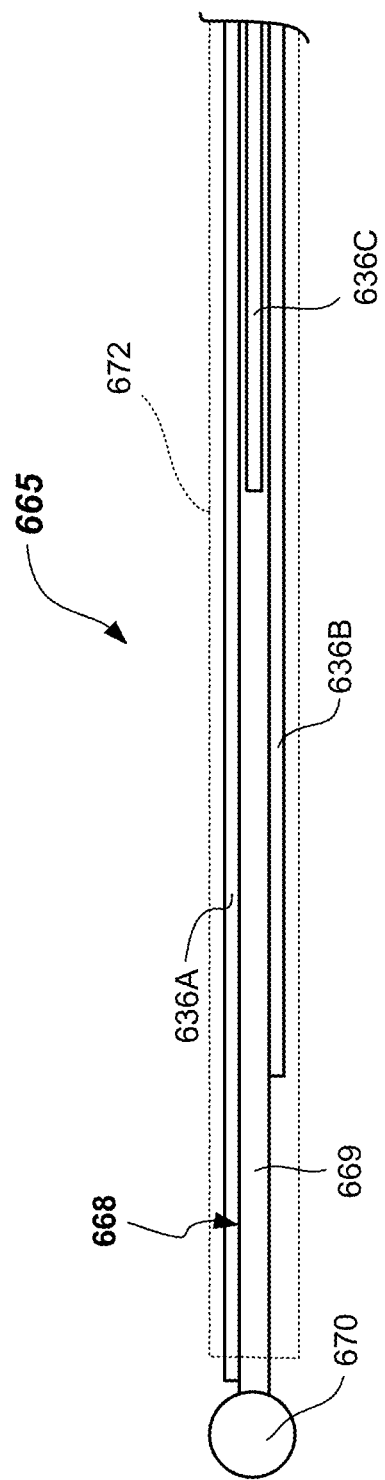
FIG. 6B illustrates a partial side view of a portion of a fiber assembly adapted to be inserted into a groove after bonding of the upper member to the lower member according to embodiments.

To accomplish insertion into the grooves 635 after bonding, multiple optical fibers (e.g., optical fibers 636A, 636B, 636C shown), which may be metal-filmed (e.g., gold-filmed) optical fibers as previously described, may be bundled into a fiber assembly 665 as shown in FIG. 6B. The fiber assembly 665 may include a core 668 that may include a pusher wire 669 with a guide member 670, such as a spherical-shaped plastic tip formed thereon. Other types of guide members 670 may be used. This core 668 provides the stiffness and guiding capability in order to thread the fiber assembly 665 into the grooves 635.

Optical fibers 636A, 636B, 636C are shown bundled around the pusher wire 669, with the terminal ends of the optical fibers 636A, 636B, 636C being staggered along a length of the fiber assembly 665. Heat shrink tubing 672 (shown dotted) may be used to secure the components of the fiber assembly 665 together. Other means, such as a suitable adhesive, may be used for bundling together the fiber assembly 665.

The pusher wire 669 may be made of a high temperature alloy, such as Inconel 600, suitable for operation at high temperature (e.g., about 650° C.). The pusher wire 669 may be gold plated, so to reflect laser energy back to the surrounding ceramic material of the upper member 234 (not shown) and lower member 632. The heat shrink tubing 672 and guide member 670 may be made of PTFE, which can be pyrolized during the high temperature bond process or in a separate removal process. The pyrolization process has the benefit of completely eliminating the PTFE material.

In one or more embodiments, the optical fibers 636A, 636B, 636C of the fiber assembly 665 may include angled cleaves (e.g. 45 degrees) so the laser energy fires off to a side. The direction that the angled cleave of the optical fibers 636A, 636B, 636C point may not be controlled. Each individual optical fiber 636A, 636B, 636C may point up, down, or to the side. Three optical fibers (e.g., fiber 636A, 636B, 636C) are shown in the depicted embodiment. However, about two to about fifty optical fibers, or even two to a hundred may be included in each fiber assembly 665. About five to about twenty optical fibers may be preferable in each fiber assembly 665.

The lower member 632 of the thermal temperature control apparatus as illustrated in FIG. 6A has 132 pixels spaced at about 1 inch (about 25 mm) along each groove 635. The dots shown on each groove 635 illustrate a location of a termination of a fiber (636A, 636B, 636C, etc.) along each groove 635 when the fiber assembly 665 of FIG. 6B is fully inserted into the grooves 635. The number of pixels may be made to be larger or smaller. Fiber assemblies 665 may be inserted and threaded to the correct depth in the respective grooves 635 such that an end of the fiber assembly 665 is located at the end of the groove 635. Other suitable fiber assemblies 665 and assembly methods may be used.

Figure 7:
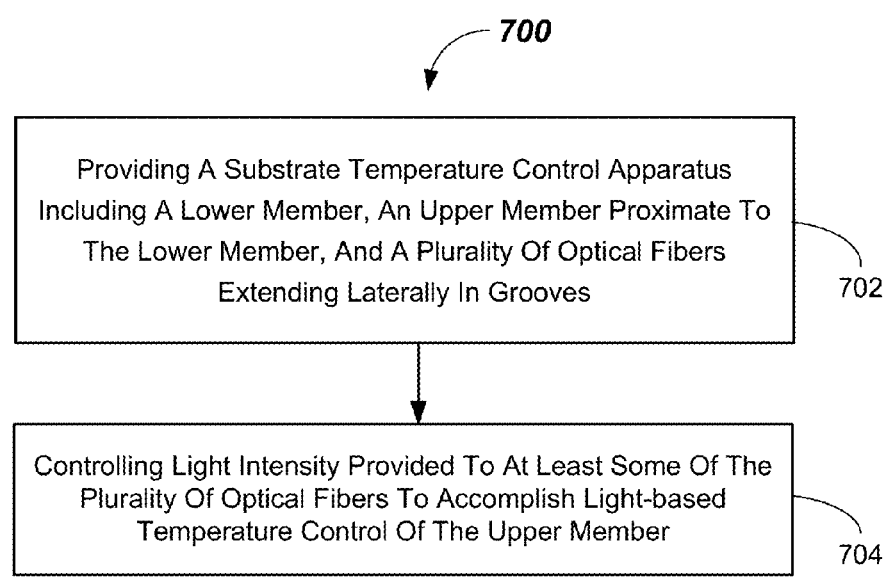
FIG. 7 illustrates a flowchart depicting a method of processing substrates according to embodiments.

A method of processing substrates, such as within an electronic device processing system (e.g., electronic device processing system 100) will be described with reference to FIG. 7 herein. The method 700 includes, in 702, providing a substrate temperature control apparatus (e.g., substrate temperature control apparatus 130) including a lower member (e.g., lower member 232, 532, 632), an upper member (e.g., upper member 234) proximate to the lower member, and a plurality of optical fibers (e.g., optical fibers 236, 636A, 636B, 636C) extending laterally in grooves (e.g., grooves 235, 535, 635). Optical fibers may be installed in grooves before or after bonding the upper member to the lower members.

The method 700 further includes, in 704, controlling light intensity provided to at least some of the plurality of optical fibers to accomplish light-based temperature control of the upper member. Of course, temperature control of the upper member also controls temperature of the substrate (e.g., substrate 240) that is in thermal contact therewith. In one or more embodiments, the method 700 may further comprise heating the substrate temperature control apparatus by way of a coupled temperature unit (e.g., temperature unit 122) and thermal elements (e.g., thermal elements 242).

The method 700 of controlling temperature of the substrate 240 may include providing temperature feedback, such as through the use of optical sensors (e.g., optical sensors) embedded in one or more of the grooves 235, 535, 635. In some embodiments, large numbers of embedded optical sensors may be used. In others, model based control and a lesser number of temperature sensors may be employed. The control methodology for controlling the optical fibers 236 may be adjusted based on feedback from the process taking place in the process chamber (e.g., process chamber 106B), such as by measuring process results on the substrate 240.

The foregoing description discloses only example embodiments of the invention. Modifications of the above-disclosed apparatus, systems, and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:
1. A substrate temperature control apparatus, comprising:
a lower member;
an upper member proximate to the lower member, the upper member having a top surface;
a plurality of grooves formed in one or more of the upper member and the lower member, each groove of the plurality of grooves being substantially parallel to the top surface of the upper member; and
a plurality of optical fibers, configured to provide groove-routed optical fiber heating, a first portion of each optical fiber of the plurality of optical fibers disposed within a corresponding groove of the plurality of grooves such that the first portion of each optical fiber of the plurality of optical fibers is substantially parallel to the top surface of the upper member.

2. A substrate temperature control apparatus, comprising:
a lower member;
an upper member proximate to the lower member;
a plurality of grooves formed in one or more of the upper member and the lower member; and
a plurality of optical fibers adapted to provide light-based heating extending within the grooves, wherein the plurality of optical fibers include a metal film.

3. The substrate temperature control apparatus of claim 1, wherein an upper support body of the upper member, and a lower support body of the lower member, each comprise a ceramic material.

4. The substrate temperature control apparatus of claim 3, wherein the lower member comprises a transition leg extending downwardly from the lower support body.

5. The substrate temperature control apparatus of claim 1, wherein each groove of the plurality of grooves is formed in an upper surface of the lower member.

6. The substrate temperature control apparatus of claim 1, wherein each groove of the plurality of grooves is formed in a lower surface of the upper member.

7. The substrate temperature control apparatus of claim 1, wherein the lower member includes a passage, and a second portion of each optical fiber of the plurality of optical fibers passes through the passage as a bundle.

8. The substrate temperature control apparatus of claim 7, wherein the passage includes a radius extending to the plurality of grooves.

9. The substrate temperature control apparatus of claim 7, wherein the passage extends through a transition leg extending downwardly from a lower support body.

10. The substrate temperature control apparatus of claim 1, wherein at least some optical fibers of the plurality of optical fibers include a barrier within or on at least some corresponding grooves of the plurality of grooves.

11. The substrate temperature control apparatus of claim 10, wherein the barrier comprises a sheath encasing at least some optical fibers of the plurality of optical fibers.

12. The substrate temperature control apparatus of claim 1, wherein a second portion of each optical fiber of the plurality of optical fibers passes through a passage in the lower member as a bundle, the bundle disposed in a potting material within the passage.

13. The substrate temperature control apparatus of claim 1, comprising an optical temperature sensor within one or more grooves of the plurality of grooves.

14. The substrate temperature control apparatus of claim 1 wherein the plurality of grooves are provided in a pattern including one or more radial spokes.

15. The substrate temperature control apparatus of claim 1, wherein the plurality of grooves are provided in a pattern including one or more circular groove sections.

16. The substrate temperature control apparatus of claim 1, configured to operate at 500° C. or above.

17. The substrate temperature control apparatus of claim 1, wherein one or more optical fibers of the plurality of optical fibers terminate at a corresponding diffuser of one or more diffusers within the corresponding groove of the plurality of grooves.

18. A substrate temperature control system, comprising:
a groove-routed optical fiber heating system including
  a substrate temperature control apparatus including an upper member having a top surface, a lower member, and a plurality of optical fibers, each optical fiber of the plurality of optical fibers extending laterally in a corresponding one of a plurality of grooves, each groove of the plurality of grooves substantially parallel to the top surface of the upper member;
  a plurality of light sources coupled to at least some optical fibers of the plurality of optical fibers; and
  an optical controller adapted to control light intensity in each optical fiber of the plurality of optical fibers.

19. An electronic device processing system, comprising:
a process chamber adapted to carry out a process on a substrate;
a substrate temperature control apparatus within the process chamber, the substrate temperature control apparatus including a lower member; an upper member having a top surface, and adapted to be in thermal contact with the substrate; and a plurality of optical fibers extending laterally in a corresponding plurality of grooves; and
a temperature controller coupled to the plurality of optical fibers and adapted to control light intensity in the plurality of optical fibers to provide temperature control of the upper member;
wherein the plurality of optical fibers extending laterally in a corresponding plurality of grooves are substantially parallel to the top surface.

20. A method of processing substrates, comprising:
providing a substrate temperature control apparatus including a lower member, an upper member having a top surface, the upper member being proximate to the lower member, and a plurality of optical fibers extending laterally in a corresponding plurality of grooves; and
controlling light intensity provided to at least some of the plurality of optical fibers to accomplish groove-routed optical fiber-based temperature control of the upper member;
wherein each optical fiber of the plurality of optical fibers is substantially parallel to the top surface of the upper member.

* * * * *